United States Patent [19]

Haus et al.

[11] Patent Number: 5,208,822
[45] Date of Patent: May 4, 1993

[54] SEMICONDUCTOR ELEMENT HAVING OPPOSITE SIGNS OF $\alpha$ PARAMETER

[75] Inventors: Hermann A. Haus, Lexington, Mass.; Katsuyuki Utaka, Tokyo, Japan

[73] Assignee: Kokusai Denshin Denwa Co., Ltd., Tokyo, Japan

[21] Appl. No.: 732,284

[22] Filed: Jul. 18, 1991

[30] Foreign Application Priority Data

Jul. 19, 1990 [JP] Japan .................................. 2-189330

[51] Int. Cl.[5] .............................................. H01S 3/19
[52] U.S. Cl. ........................................ 372/50; 372/26; 372/46; 372/96
[58] Field of Search .................. 372/46, 50, 96, 20, 372/26, 28

[56] References Cited

U.S. PATENT DOCUMENTS 4,847,856 7/1989 Sugimura et al. ...................... 372/50
5,060,235 10/1991 Ikeda ...................................... 372/50

Primary Examiner—James W. Davie
Attorney, Agent, or Firm—Nikaido, Marmelstein, Murray & Oram

[57] ABSTRACT

A semiconductor optical element comprises a semiconductor substrate, a waveguide, an active layer and a clad layer mounted on said substrate; said active layer comprising first region and second region coupled optically with each other, and having opposite signs of $\alpha$ parameters with each other, where said parameter is ratio of change of refractive index to change of gain following change of carrier density; a first electrode common to all regions attached on one side of said substrate; and second electrodes for each region attached on the other side of said substrate. The invention is used for an AM modulation laser, or an FM modulation laser.

11 Claims, 8 Drawing Sheets

$\lambda_i = 2 \Lambda n_i$
$(i=1,2)$

SEMICONDUCTOR ELEMENT HAVING OPPOSITE SIGNS OF α PARAMETER

BACKGROUND OF THE INVENTION

The present invention relates to semiconductor optical elements and its application to laser diodes which operate with net optical gain or net refractive index kept almost constant even if the other parameter is varied.

Change of injected carrier density, optical gain, and refractive index are related to each other in a semiconductor medium. This results in chirping under a high speed modulation or unwanted amplitude modulation even if pure frequency modulation is desired by changing the injection currents in conventional semiconductor laser diodes. These phenomena degrade transmission performance in optical fiber communication systems, which limit the repeater span due to dispersion or noise. In order to avoid these problems and realize ideal AM (amplitude modulation) or FM (frequency modulation) lasers, external modulators are usually employed. These schemes, however, have drawbacks such as rather complicated device structure, larger size, as well as the limits on the achievable modulation index of FM lasers.

As for a wavelength tunable filter in which a corrugation grating is formed along an active layer and the Bragg wavelength is varied by changing the refractive index associated with carrier injection in the active layer, this carrier change is also accompanied by a gain change leading to changes of transmission and reflection efficiencies at the Bragg wavelength. This structure requires a gain adjusting region to keep the insertion loss constant.

SUMMARY OF THE INVENTION

The invention as described in the following is motivated by a desire to overcome such problems and to provide semiconductor laser diodes which operate with almost constant optical gain or refractive index under modulation.

The invention comprises first and second semiconductor regions in which the signs of the ratio of refractive index change to gain change associated with injected carrier density change (hereinafter the "α parameter") are opposite to each other. The adjustment of injection currents into said regions can yield a constant refractive index even under change of the optical gain and vice versa. Henceforth, this semiconductor optical element is referred to as "opposite sign α parameter (OSAP) element".

The OSAP element can operate in three kinds of modes; the antisymmetric sign refractive index change mode ($+-$ or $-+$ mode), the positive symmetric sign refractive index change mode ($++$ mode) and the negative symmetric sign refractive index change mode ($--$ mode).

FIGS. 1(a)-(d) respectively depict, for the case of the $+-$ mode, the spectra of gain, gain change, refractive index change and α parameter of semiconductor regions I and II, whose respective bandgap energies are optimally chosen to be $Eg_1$ and $Eg_2$ ($>Eg_1$). Here the case is taken of increasing injection carrier densities in both regions. If the increases are $\Delta N_1$ and $\Delta N_2$ ($>0$), the optical gains g may change from the broken lines to the solid lines, as shown in FIG. 1(a). The gain change spectrum is as shown in FIG. 1(b). The refractive index change is related to the gain change by the Kramers-Kronig relation, and its spectrum is shown in FIG. 1(c). FIG. 1(d) shows the ratio of refractive index change $\Delta n$ to gain change $\Delta g$ due to carrier density change $\Delta N$, i.e. the α parameter $\alpha = (\Delta n/\Delta N)/(\Delta g/\Delta N)$. These spectra show that an optimal choice of the photon energy $E_0$ can make the refractive index changes of the two regions I and II equal in magnitude and opposite in sign, $\Delta n_1 = -\Delta n_2$. To attain this state requires that the photon energy $E_0$ be within the range denoted by A, in which the signs of the α parameters of the two regions are opposite to each other. Even if the absolute values of the α parameters are not equal, appropriate adjustment of the injected carrier densities can realize the above state, $\Delta n_1 = -\Delta n_2$. For the $+-$ mode shown in FIGS. 1(a)-1(d) carrier density increases in both regions, $\Delta N_1 > 0$ and $\Delta N_2 > 0$, cause the state $\Delta n_1 \approx -\Delta n_2 > 0$. Similarly, carrier density decreases in both regions render opposite signs of refractive index changes such that $\Delta n_2 \approx -\Delta n_1 > 0$, which is referred as the $-+$ mode.

FIGS. 2(a)-2(d) respectively show the spectra for the $++$ mode with an increase in the carrier density in region I and a descrease in the carrier density in region II, $\Delta N_1 > 0$, $\Delta N_2 < 0$. This case leads to an increase in the refractive indices for the both regions. Appropriate selection of photon energy and adjustment of carrier density change can make $\Delta n_1 = \Delta n_2 > 0$.

The spectra for the case of the $--$ mode in which a decrease in the carrier density in region I and an increase in the carrier density in region II, $\Delta N_1 < 0$, $\Delta N_2 > 0$, are depicted in FIGS. 3(a)-3(d) contrary to the case of FIGS. 2(a)-2(d) the refractive indices of both regions decrease, and also suitable selection of the photon energy and adjustment of carrier density can realize $\Delta n_1 = \Delta n_2 < 0$.

If the OSAP element is applied to laser diodes, the $+-$ and $-+$ modes can realize an AM laser, and the $++$ and $--$ an FM laser. It is also applicable to other optical devices such as a wavelength tunable filter or reflector together with a corrugation and an optical waveguide and a phase modulator.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

(Embodiment 1)

Figure 1A:
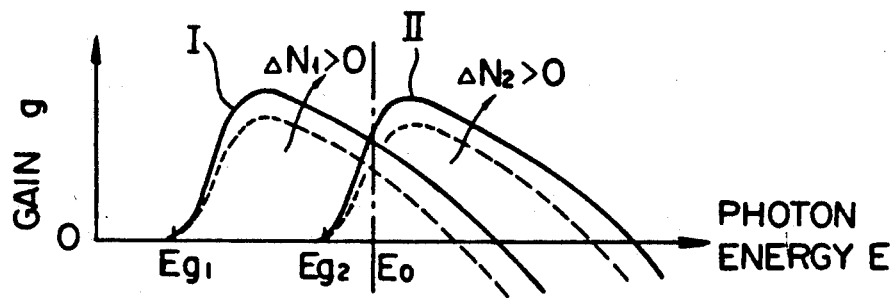
FIGS. 1(a)-1(d) respectively illustrate spectra of gain, gain charge, refractive index, and α parameter of first and second semiconductor regions for a first operating mode according to the invention.
Figure 1B:
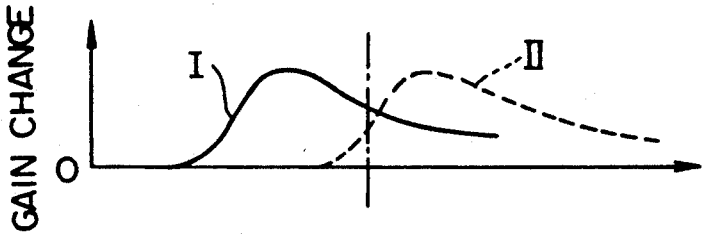
Figure 1C:
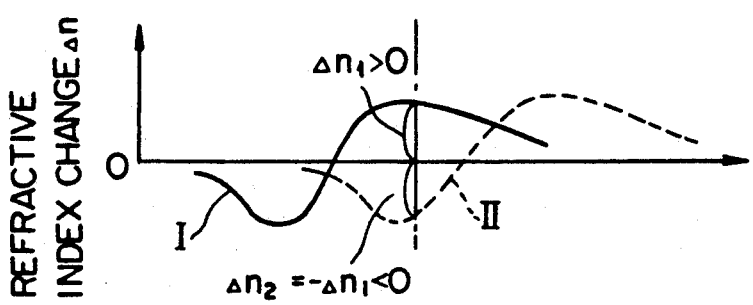
Figure 1D:
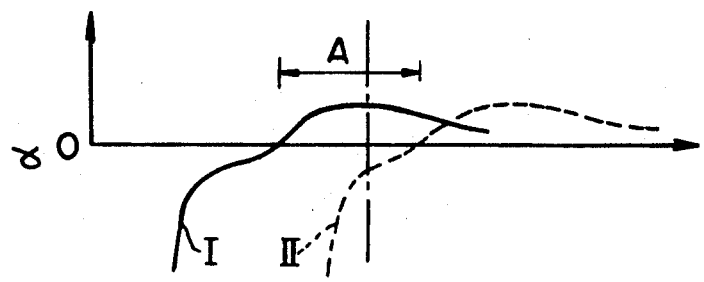
Figure 2A:
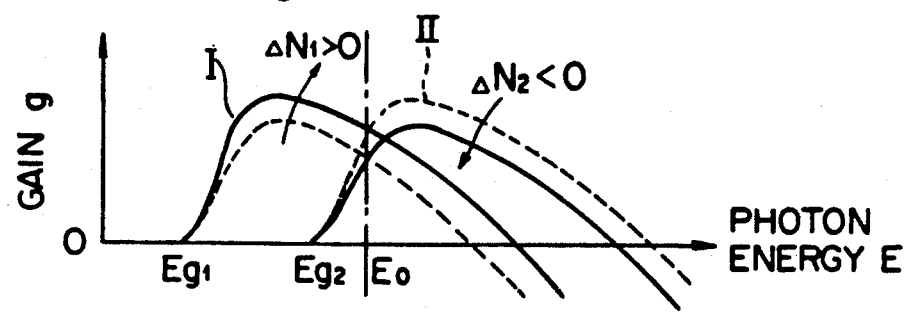
FIGS. 2(a)-2(d) respectively illustrate spectra of gain, gain change, refractive index, and α parameter of the first and second semiconductor regions for a second operating mode according to the invention.
Figure 2B:
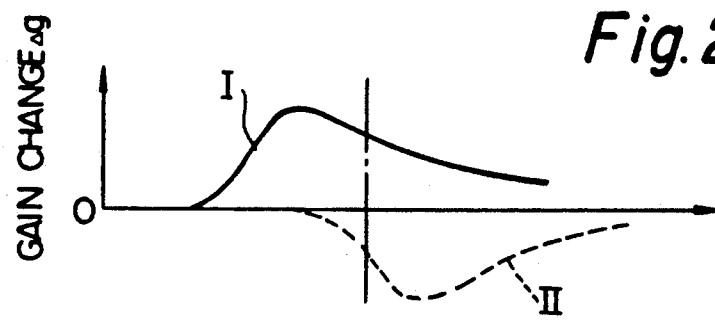
Figure 2C:
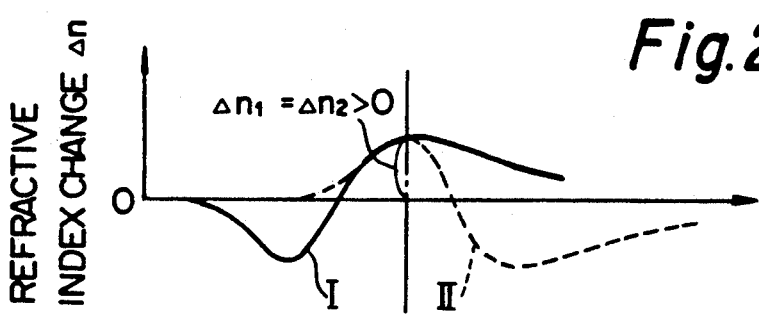
Figure 2D:
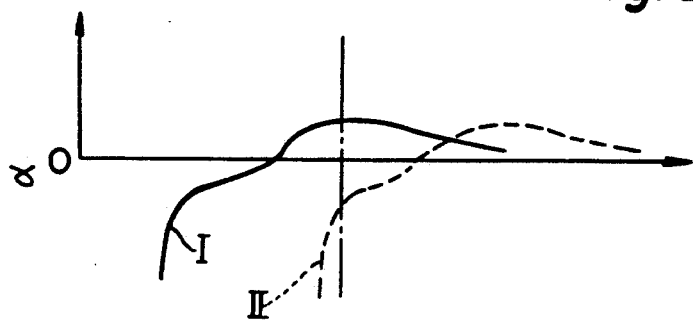
Figure 3A:
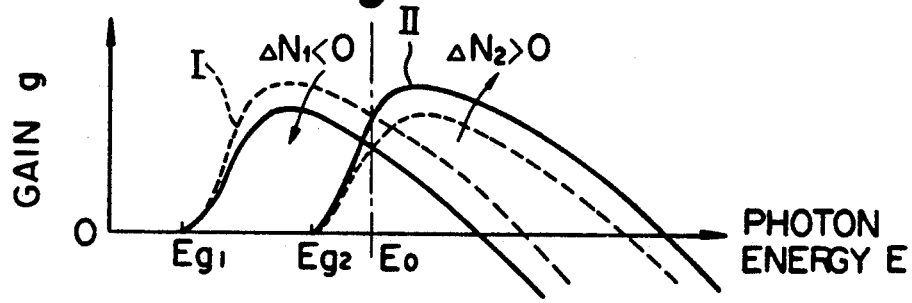
FIGS. 3(a)-3(d) are similar to FIGS. 1(a)-1(d) and 2(a)-2(d), but illustrate the spectra for a third operating mode of the invention.
Figure 3B:
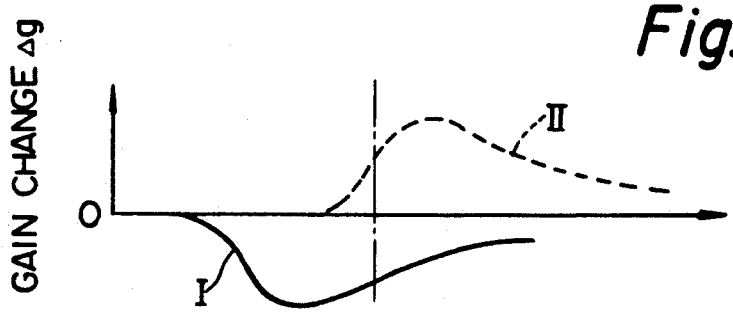
Figure 3C:
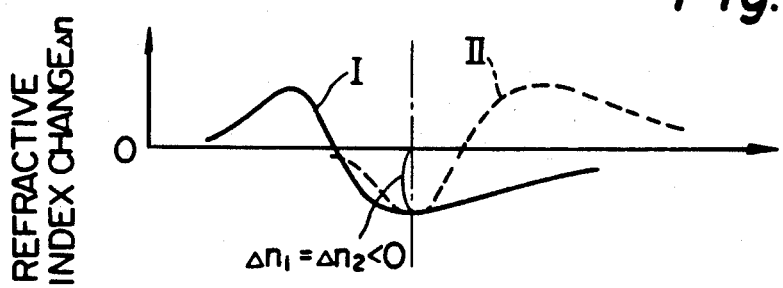
Figure 3D:
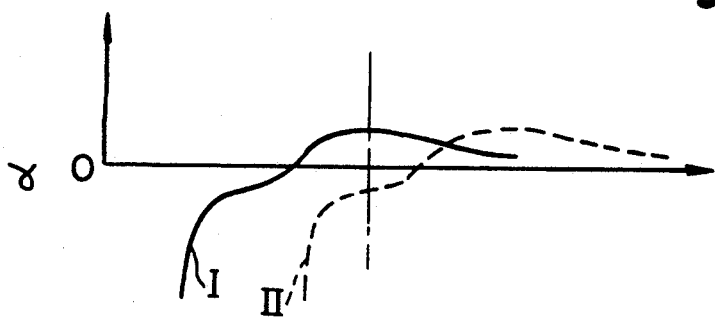
Figure 4:
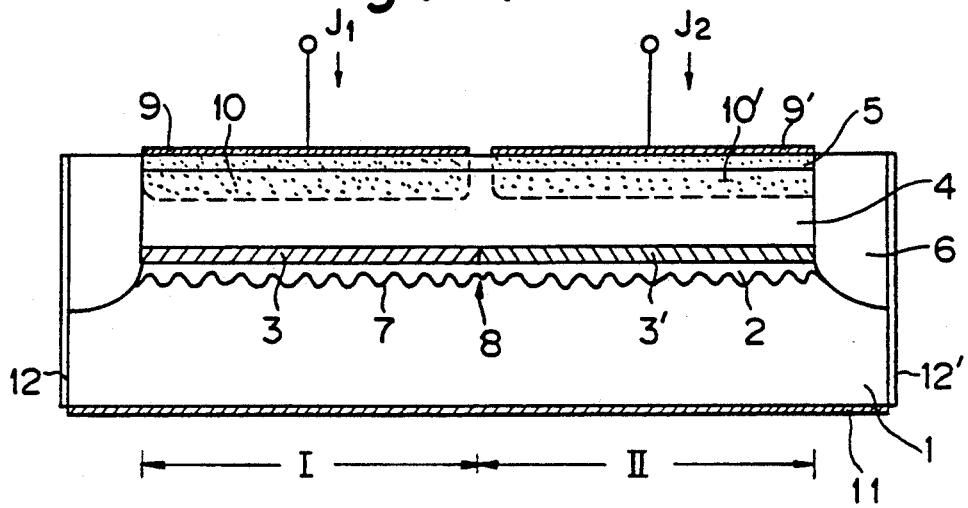
FIG. 4 is a cross-sectional view of the first embodiment according to the invention.

The first application of this OSAP element is a semiconductor laser diode in which the two regions of the OSAP element are arranged serially in the direction of light propagation. FIG. 4 schematically illustrates a cross section of the structure. Here devices operating in a 1.5 μm wavelength range are taken as examples in the following explanation.

Reference numeral 1 indicates an n-InP substrate, 2 an n-InGaAsP waveguide layer, 3 and 3' indicate InGaAsP active layers with $\alpha$ parameters of opposite signs, 4 a p-InP cladding layer, 5 a p-InGaAsP cap layer, 6 a semi-insulating InP burying layer. A $\lambda/4$-shifted corrugation 7 selects the wavelength which makes the signs of the $\alpha$ parameters of the said two active regions 3 and 3' opposite respectively, and consequently this laser operates as a window-type $\lambda/4$-shifted distributed feedback laser diode. It is noted that a $\lambda/4$-shift 8 is formed at the interface of the said two active regions. Reference numerals 9 and 9' indicate p-side electrodes for independent carrier injections to the said active layers 3 and 3', and Zn-diffused regions 10 and 10' are formed for the reduction of ohmic resistance. Reference numeral 11 indicates an n-side electrode, and 12 and 12' are anti-reflection coating films.

The operation of this embodiment is explained in the following. The signs of $\alpha$ parameters of the active layers 3 (region I) and 3' (region II) are assumed to be positive and negative, respectively. Carrier densities are changed by $\Delta N_1$ (>0) and $\Delta N_2$ (<0) by changing the injection current densities to the regions I and II from $J_1$ and $J_2$ to $J_1'$ and $J_2'$, respectively, as shown in the time plots of FIG. 5. This case corresponds to the $++$ mode, and the refractive indices of each region increase from $n_0$ to $n_0'$. It should be noted that the original refractive indices of regions I and II can be set almost equal by designing waveguide parameters such as thicknesses of the active layers 3 and 3' or barriers especially for the application of quantum well structure as described later. Consequently, the lasing wavelength, which is determined by the corrugation period and refractive index, can be changed from $\lambda_0$ to $\lambda_0'$. At the same time, since the net optical gain can be fixed even under these refractive index changes, the output power is also kept almost constant at $P_0$. On the other hand, return of injection current densities in both regions, from $J_1'$ and $J_2'$ to the original levels $J_1$ and $J_2$, also reduces the refractive indices to the original values $n_0$ from $n_0'$ due to the $--$ mode so that the same thing happens for the lasing wavelength from $\lambda_0'$ to $\lambda_0$, during which operation the output power remains almost constant at $P_0$. This means a laser diode is realized whose lasing wavelength can be modulated by change of injection currents with constant output power, a so-called FM laser. From another point of view, it can work as a tunable laser. In this case, the changes of the injection current densities are adjusted so as to attain almost the same refractive index changes in both regions while keeping the net gain constant.

(EMBODIMENT 2)

Figure 6:
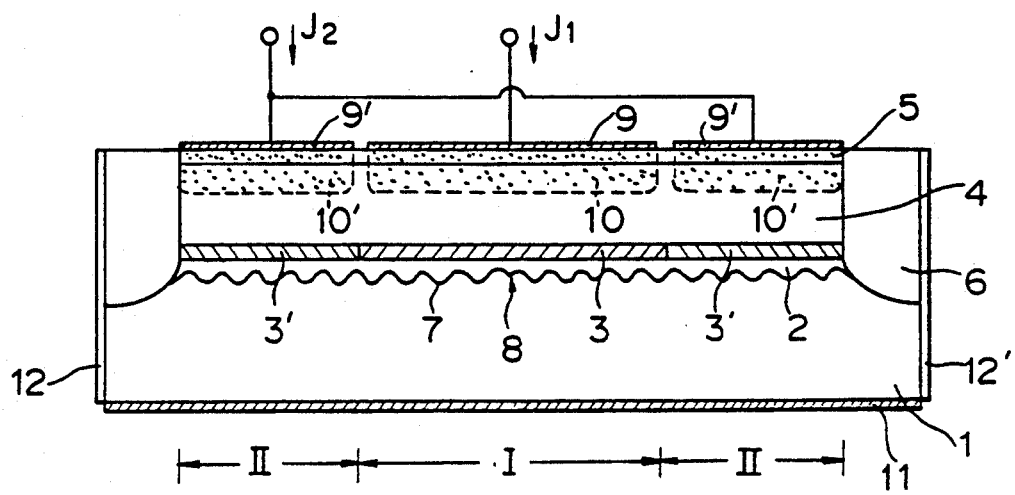
FIG. 6 is a cross-sectional view of the second embodiment according to the invention.

FIG. 4 is an embodiment which is composed of two regions, and the same effect as described in embodiment 1 can be realized even if a three region structure is adopted as shown in FIG. 6. This structure is symmetric, and a $\lambda/4$-shift is formed in region I, which may lead to better uniformity around a $\lambda/4$-shift and easier gain adjustment. It is needless to say that a change of the relative positions of regions I and II produces the same effect.

This embodiment suggests the number of regions can be increased owing to the same principle.

(EMBODIMENT 3)

Figure 7:
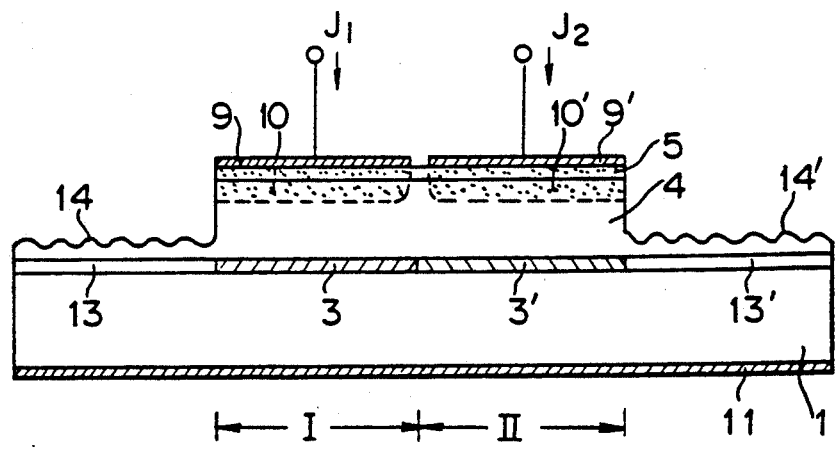
FIG. 7 is a cross-sectional view of the third embodiment according to the invention.
Figure 8:
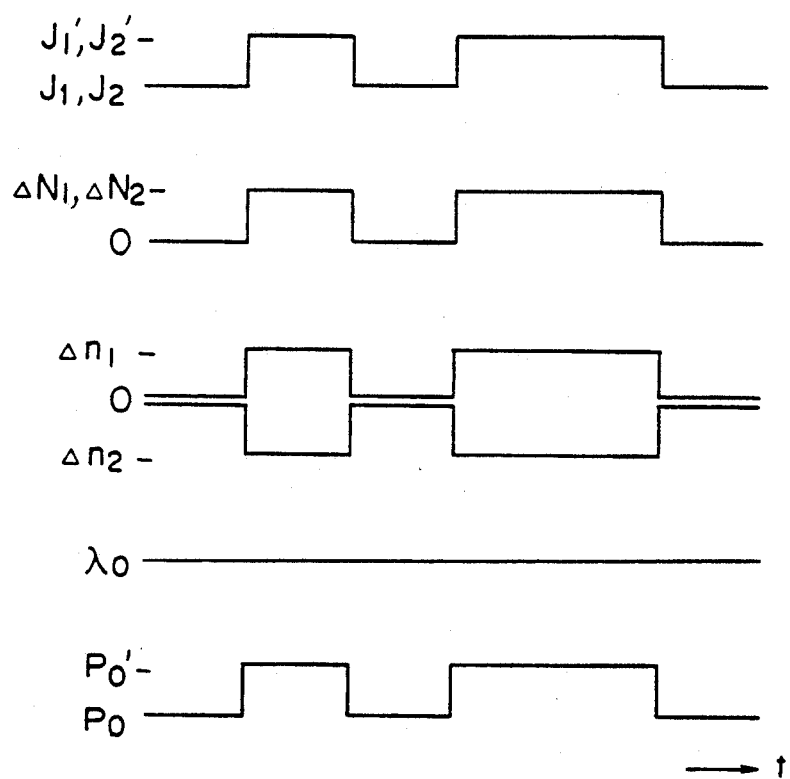
FIG. 8 presents time plots explaining the operation of the second embodiment according to the invention.

The example of an embodiment in which this invention is applied to a distributed Bragg reflector is shown in FIG. 7. It contains InGaAsP passive waveguides 13 and 13' in the extension along the light propagation of active regions I and II in which the signs of the $\alpha$ parameters are opposite, and gratings 14 and 14' for distributed reflectors on said respective waveguides so as to select the wavelength. FIG. 8 illustrates time plots to explain the operation of this embodiment. When the injection current densities increase from $J_1$ and $J_2$ to $J_1'$ and $J_2'$, the carrier densities also increase in both regions. The refractive indices, however, change in different directions due to the opposite signs of the $\alpha$ parameters, such as an increase in region I and a decrease in region II, which corresponds to the $+-$ mode. If the refractive index changes are $\Delta n_1$ and $\Delta n_2$, the phase change in the active regions given by $\Delta n_1 \cdot L_1 + \Delta n_2 \cdot L_2$, where $L_1$ and $L_2$ are the lengths of said active regions I and II, respectively. Since the signs of $\Delta n_1$ and $\Delta n_2$ are opposite, said phase change can remain null by adjusting the absolute values of $\Delta n_1$ and $\Delta n_2$. Consequently, the lasing wavelength $\lambda_0$, which is determined by the phase condition in a laser cavity, also remains unchanged. On the other hand, the output power increases from $P_0$ to $P_0'$ owing to increase of carrier densities to both regions. Contrary, decrease of injection current densities in both regions only inverts the signs of change of each parameter and keeps the amount of phase change zero, so that the lasing wavelength remains unchanged. This embodiment operates as an ultra low chirp AM laser in which the lasing wavelength is held constant and only the optical intensity is modulated.

Figure 5:
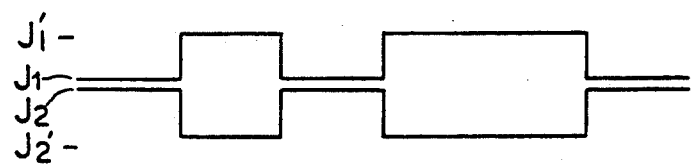
FIG. 5 presents a time plot explaining the operation of the first embodiment according to the invention.
Figure 5:
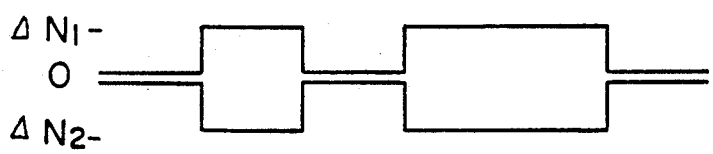
Figure 5:
Figure 5:
Figure 5:

It should be noted that this embodiment also operates in the manner of the $++$ or $--$ modes as shown in the time plots of FIG. 5. It works as an FM laser.

(Embodiment 4)

Figure 9A:
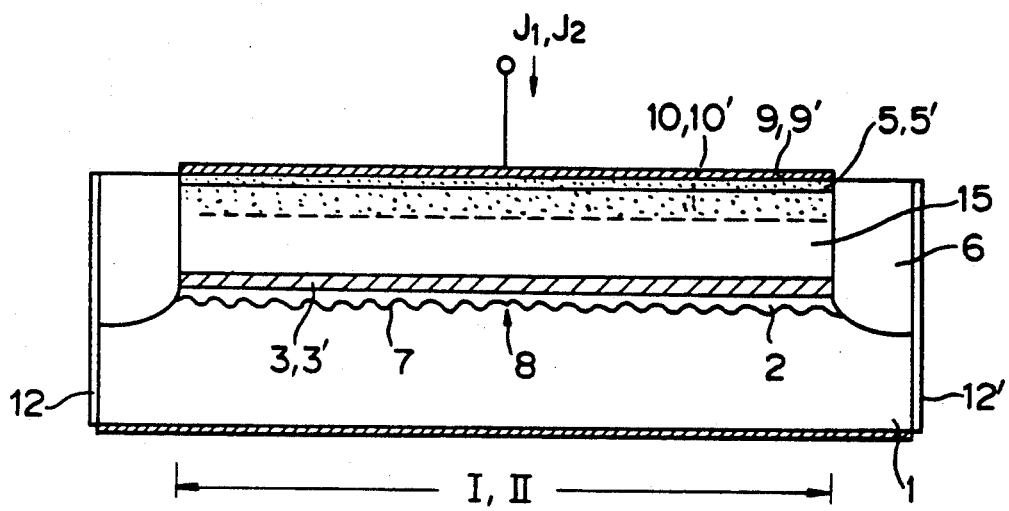
FIGS. 9(a) and 9(b) are cross-sectional views of the forth embodiment according to the invention.
Figure 9B:
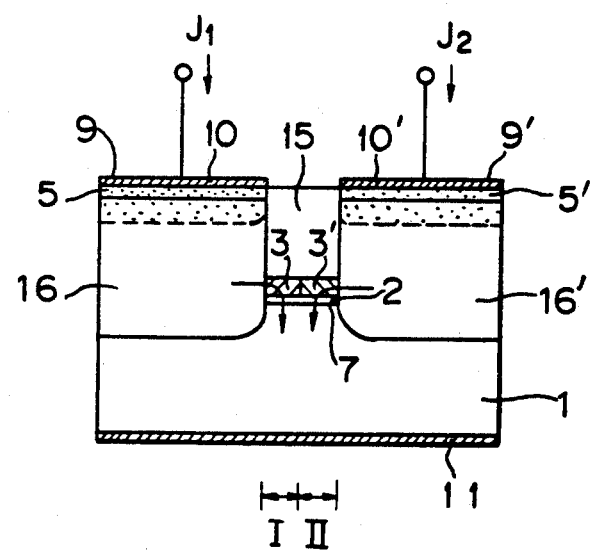

The embodiments described above include the OSAP elements in which two kinds of regions with $\alpha$ parameters of opposite signs are arranged in series in the direction of light propagation. The same effect is expected even if said two regions are arranged in parallel. This embodiment is shown in FIGS. 9(a) and 9(b). This is a window-type $\lambda/4$-shifted distributed feedback structure, and FIG. 9(a) illustrates the schematic cross section in the direction of light propagation and 9(b) one perpendicular to it.

As shown in FIG. 9(b), two kinds of active regions 3 (region I) and 3' (region II) with $\alpha$ parameters of opposite signs are arranged in parallel to form a stripe. Consequently, a transverse mode propagates with a profile containing said stripe. Reference numeral 15 indicates a semi-insulating InP cladding layer, 16 and 16' p-InP layers, and carriers can be injected independently to each region I and II through each electrode 9 and 9' as shown by the arrows in the figure. This embodiment can operate in all the modes described in FIG. 5 and FIG. 8, employing the same principles, and realizes AM, FM and wavelength tunable lasers. This embodiment effectively avoids propagation delay and nonuniformity along the light propagation, since said two regions are formed in parallel and said transverse mode experiences gain changes and/or refractive index changes of said two regions in the same cross section.

(Embodiment 5)

Figure 10:
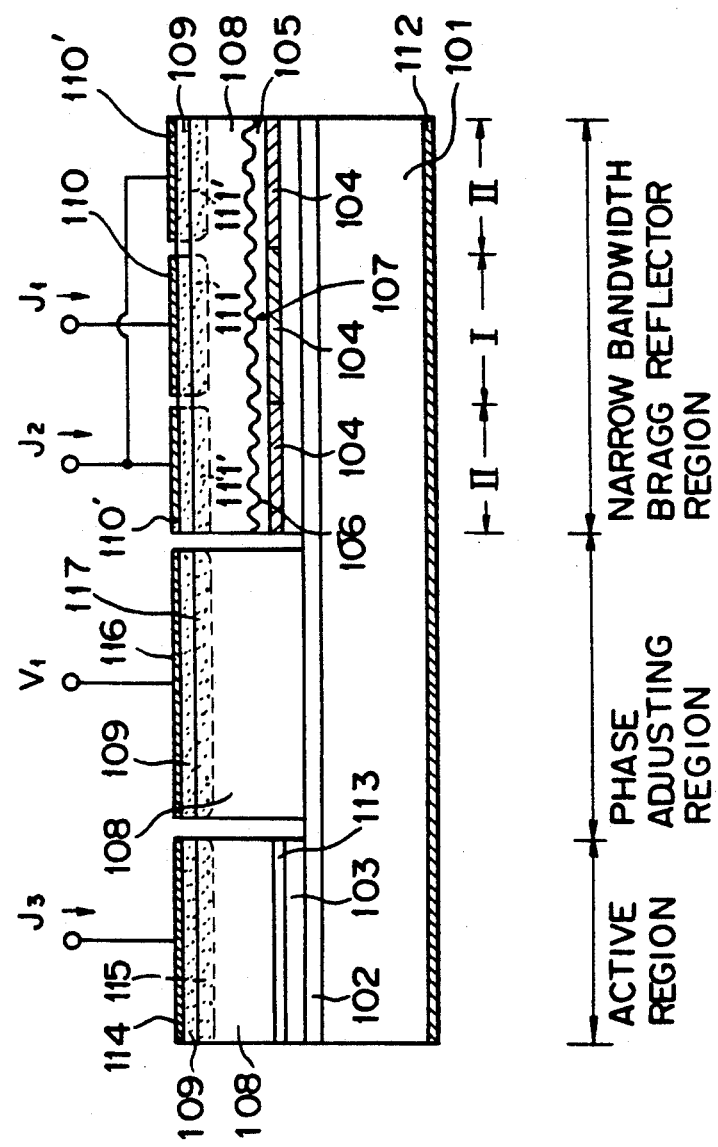
FIG. 10 is a cross-sectional view of the fifth embodiment according to the invention.

The embodiment in which the OSAP element according to this invention is applied to a wavelength tunable reflection type filter for a wavelength tunable laser is schematically shown in FIG. 10. This embodiment consists of three regions, namely an active region, a phase adjusting region and a narrow bandwidth Bragg reflector. In this reflector, a directional coupler in which two waveguides with almost the same propagation constants are closely arranged in parallel is utilized. A $\lambda/4$-shifted corrugation grating is formed on one of said waveguides, and light is fed in and taken out through the other waveguide. A center wavelength of reflection can be tuned by changing the refractive indices of said waveguide on which a $\lambda/4$-shifted grating is formed.

A narrow bandwidth Bragg reflector region contains an n-InP substrate 101, an n-InGaAsP low-loss waveguide layer 102, an n-InP layer 103, InGaAsP active regions I and II with $\alpha$ parameters of opposite signs 104 and 104', and a p-InGaAsP layer 105, on which a $\lambda/4$-shifted grating 106 is formed for a filter where reference numeral 107 indicates a $\lambda/4$-shift. Also a p-InP cladding layer 108, InGaAsP cap layer 109, a p-side electrodes 110 and 110' for carrier injection to each region, Zn-diffused regions 111 and 111' and an n-side electrode 112 are included. In said active region, an InGaAsP active layer 113 is comprised, and said active layer 113 does not necessarily have the same composition as layers 104 and 104'. As for said phase adjusting region, it consists of said n-InGaAsP waveguide layer 102 and a p-InP cladding layer 108.

Said narrow bandwidth Bragg reflector of this embodiment fundamentally performs the same functions as those of the embodiment shown in FIG. 6 as far as the structure including above said active layers 104 and 104' is concerned. The + + or − − modes operation makes the net optical gain constant and varies the refractive index uniformly. The difference from FIG. 6 is that this embodiment contains another waveguide 102 coupled with said active layers 104 and 104' by the manner of a directional coupler, and light propagating from said phase adjusting region couples into said active layers 104 and 104' in said narrow bandwidth Bragg reflector region. As is well known, a $\lambda/4$-shifted grating can fairly confine the light of Bragg wavelength, and thus confined light couples back again into the original waveguide 102 and propagates out to left direction. This indicates that said reflector works as a narrow bandwidth reflector which is effective only for the Bragg wavelength. Since the Bragg wavelength is determined by the corrugation period and refractive index of a waveguide, said + + or − − mode operations can change the reflection wavelength while keeping the reflectivity constant. Light at said Bragg wavelength is amplified in the active region and its phase is adjusted in the phase adjusting region to oscillate. Note that a phase adjustment by the electrooptic effect, in which a reverse voltage $V_1$ is applied, seems effective in avoiding an excessive loss increase, but the method of carrier injection may attain the same effect. Since, as mentioned above, a tunable laser according to this invention not only has excellent wavelength selectivity but also does not increase its threshold excessively even under the wavelength tuning action, spectral properties may not deteriorate in the tuning operation even if applied to a narrow linewidth laser. Accordingly, an narrow linewidth-tunable laser is realized.

The OSAP elements are obtained by adjusting the compositions whose bandgap energies are suitable and by selecting an optimal wavelength by corrugation gratings. Not limited by conventional bulk semiconductors, these regions may be constructed by quantum wells, wires or boxes, which offer the advantage of easy assignment of optimal wavelength and less deviation of wavelength under change of injection current, so that operation in wider wavelength ranges can be expected.

In the above description, an InGaAsP crystal system for 1.5 $\mu$m wavelength operation was used as an example, and AlGaAs, AlInGaAs, AlGaInP, AlGaAsSb and other crystal systems are also appropriate.

As described above, according to this invention which contains two kinds of semiconductor regions with $\alpha$ parameters of opposite signs, either optical gains or refractive indices can be changed with the other kept constant by adjusting injection currents to each region. This feature realizes an ultra-low chirp laser, an ideal FM laser, a high performance wavelength tunable laser and so on. Consequently, this invention is appropriate for light sources for long-haul large capacity transmission schemes by direct modulation intensity detection or coherent schemes and for lightwave multiplexing systems.

From the foregoing it will now be apparent that a new and improved semiconductor optical element has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A semiconductor optical element, comprising:
   a semiconductor substrate;
   an active layer comprising a first region and a second region coupled optically with each other, and having at least one of different compositions and different thicknesses with each other,
   a corrugation grating formed along said active layer, said corrugation grating for selecting predetermined wavelengths to make signs of an $\alpha$ parameter of each region opposite, wherein said $\alpha$ parameter is a ratio of change of refractive index to change of gain following a change of carrier density; said semiconductor optical element further comprising:
   cladding layers disposed on a first and a second side of said active layer, wherein one of said cladding layers is disposed on said semiconductor substrate;
   electrode means disposed on said semiconductor optical element, for injecting current into said semiconductor optical element to vary carrier densities in the active layer.

2. The element according to claim 1, wherein said first and second regions comprise at least one of quantum wells, quantum wires, and quantum boxes.

3. The element according to claims 1 or 2, wherein said first and second regions are arranged in series in a direction of light propagation.

4. The element according to claims 1 or 2, wherein said first and second regions are arranged in parallel in a direction of light propagation.

5. The element according to claims 1 or 2, wherein said first and second regions have means for independent carrier injection.

6. The element according to claims 1 or 2, wherein said corrugation grating is disposed along said first and second regions to select the wavelength which makes respective signs of α parameters of said first and second regions to be opposite to each other.

7. The element according to claim 6, wherein said corrugation grating comprises λ/4-shifted corrugation.

8. The element according to claims 1 or 2, wherein said corrugation gratings are disposed outside said first and second regions to select the wavelength which makes respective signs of α parameters of said first and second regions be opposite to each other.

9. The element according to claims 1 or 2, further comprising a third region coupled along an entire length of said first and second regions, said third region having a propagation constant substantially the same as a propagation constant of said first and second regions.

10. The element according to claim 9, further comprising a reflection means, such as a cleaved facet or a corrugation grating, at an extension position of said third region.

11. A semiconductor optical element comprising;
a semiconductor substrate,
a wave-guide, an active layer and a clad layer mounted on said semiconductor substrate,
said active layer comprising first region and second region coupled optically with each other, and having opposite signs of α parameters with each other, where said parameter is ratio of change of refractive index to change of gain following change of carrier density,
a first electrode common to all regions attached on one side of said substrate, and
second electrodes for each region attached on the other side of said substrate.

* * * * *